(12) United States Patent
Zhang et al.

(10) Patent No.: US 11,528,822 B2
(45) Date of Patent: Dec. 13, 2022

(54) FLEXIBLE DISPLAY SCREEN COVER PLATE, FLEXIBLE DISPLAY MODULE AND FLEXIBLE DISPLAY DEVICE

(71) Applicant: Yungu (Gu'an) Technology Co., Ltd., Langfang (CN)

(72) Inventors: Deqiang Zhang, Langfang (CN); Mingxing Liu, Langfang (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 459 days.

(21) Appl. No.: 16/735,868

(22) Filed: Jan. 7, 2020

(65) Prior Publication Data

US 2020/0260604 A1 Aug. 13, 2020

Related U.S. Application Data

(63) Continuation of application No. PCT/CN2019/082852, filed on Apr. 16, 2019.

(30) Foreign Application Priority Data

Jul. 10, 2018 (CN) .......................... 201810752982.8

(51) Int. Cl.
*H05K 5/03* (2006.01)
*H05K 5/00* (2006.01)

(52) U.S. Cl.
CPC ............. *H05K 5/03* (2013.01); *H05K 5/0017* (2013.01)

(58) Field of Classification Search
CPC .................... H01L 2251/5338; H01L 51/0097
See application file for complete search history.

(56) References Cited

U.S. PATENT DOCUMENTS

| | | | |
|---|---|---|---|
| 2005/0069713 | A1 | 3/2005 | Gupta et al. |
| 2015/0014030 | A1* | 1/2015 | Mitamura ............... B32B 27/32 |
| | | | 524/106 |

(Continued)

FOREIGN PATENT DOCUMENTS

| | | |
|---|---|---|
| CN | 203474643 U | 3/2014 |
| CN | 203474644 U | 3/2014 |

(Continued)

OTHER PUBLICATIONS

Chinese First Office Action for CN Application No. 201821090165.2 dated Nov. 27, 2018.

(Continued)

*Primary Examiner* — Van N Chow
(74) *Attorney, Agent, or Firm* — Ladas & Parry LLP (57) ABSTRACT

A flexible display screen cover plate, a flexible display module and a flexible display device are provided by the present application. The flexible display screen cover plate includes a composite laminated structure including at least one flexible glass layer and at least one organic layer that are laminated. By providing the composite lamination structure including the at least one flexible glass layer and the at least one organic layer and utilizing rigid characteristics of a glass material and flexible characteristics of an organic material, the flexible display screen cover plate with both a bendability and a sufficient hardness can be ensured, and the bendability of the flexible display screen cover plate can be improved.

18 Claims, 8 Drawing Sheets

(56) References Cited

U.S. PATENT DOCUMENTS

| | | | | |
|---|---|---|---|---|
| 2018/0366527 A1* | 12/2018 | Xu | .................. | H01L 51/508 |
| 2020/0052246 A1* | 2/2020 | Yuan | .................. | H01L 51/5246 |
| 2020/0260604 A1* | 8/2020 | Zhang | .................. | H05K 5/03 |
| 2021/0132279 A1* | 5/2021 | Numata | .............. | G02B 6/0035 |

FOREIGN PATENT DOCUMENTS

| | | | |
|---|---|---|---|
| CN | 104465475 | A | 3/2015 |
| CN | 104685627 | A | 6/2015 |
| CN | 105185809 | A | 12/2015 |
| CN | 105867546 | A | 8/2016 |
| CN | 206505922 | U | 9/2017 |
| CN | 107452284 | A | 12/2017 |
| CN | 107765921 | A | 3/2018 |
| CN | 107799574 | A | 3/2018 |
| CN | 107871453 | A | 4/2018 |
| CN | 207339953 | U | 5/2018 |
| CN | 207818084 | U | 9/2018 |
| CN | 108962028 | A | 12/2018 |
| CN | 208737340 | U | 4/2019 |

OTHER PUBLICATIONS

PCT International Search Report of PCT/CN2019/082852 dated Jun. 27, 2019.
PCT Written Opinion of PCT/CN2019/082852 dated Jun. 27, 2019.
Chinese First Office Action for CN Application No. 201810752982.8 dated May 17, 2019 and English Translation thereof.
Chinese Second Office Action for CN Application No. 201810752982.8 dated Oct. 24, 2019 and English Translation thereof.

* cited by examiner

FLEXIBLE DISPLAY SCREEN COVER PLATE, FLEXIBLE DISPLAY MODULE AND FLEXIBLE DISPLAY DEVICE

CROSS-REFERENCE TO RELATED APPLICATIONS

This application is a continuation of International Application No. PCT/CN2019/082852 filed on Apr. 16, 2019, which claims priority to Chinese patent application No. 201810752982.8 filed on Jul. 10, 2018. Both applications are incorporated herein by reference in their entireties.

TECHNICAL FIELD

The present application relates to the field of display technologies, and more particularly to a flexible display screen cover plate, a flexible display module and a flexible display device.

BACKGROUND

With the development of display technologies, display devices are widely applied in many application fields nowadays, and therefore a function of a display screen is gradually demanded to increase. A flexible screen has characteristics such as bendable and so on, and it can be realized that a display device is bent or folded by utilizing flexibility of the display components, thereby it is convenient for people to carry and use the display device. More and more attentions are paid to wearable display devices with flexible display panels, and the wearable display devices have shown significant application potential in fields such as entertainment and so on, and have been listed in major competitive markets in the industry.

SUMMARY

In view of this, exemplary embodiments of the present application provide a flexible display screen cover plate, a flexible display module and a flexible display device.

According to one aspect of the present application, a flexible display screen cover plate is provided, which includes a composite laminated structure including at least one flexible glass layer and at least one organic layer.

In an embodiment, the composite laminated structure includes at least one flexible glass layer and at least one organic layer that are sequentially laminated.

In an embodiment, the composite laminated structure includes at least one flexible glass layer and at least two organic layers, and each of the at least one flexible glass layer is sandwiched between two of the at least two organic layers.

In an embodiment, the at least one flexible glass layer and the at least one organic layer are connected together by adhering.

In an embodiment, the at least one flexible glass layer and the at least one organic layer are connected together by an optically transparent adhesive.

In an embodiment, the optically transparent adhesive comprises an optically clear adhesive.

In an embodiment, a thickness of the optically transparent adhesive is 5 µm~10 µm.

In an embodiment, the at least one flexible glass layer and the at least one organic layer are connected together by being embedded within each other.

In an embodiment, a surface of the at least one flexible glass layer contacted with the at least one organic layer includes at least one groove, and the at least one organic layer is embedded in the at least one groove.

In an embodiment, a cross-sectional shape of the at least one groove is selected from one or more of a square shape, a circular arc shape, an inverted trapezoidal shape, and a triangular shape.

In an embodiment, a ratio of an open area of the at least one groove to an area of the surface of the at least one flexible glass layer which includes the at least one groove is 30% to 60%.

In an embodiment, the open area of the at least one groove is 25 µm²~400 µm².

In an embodiment, a depth of the at least one groove is 2 µm~10 µm.

In an embodiment, a surface of the at least one flexible glass layer that located in a non-display region and contacted with the at least one organic layer is a rough surface.

In an embodiment, the rough surface is obtained by shot peening.

In an embodiment, a hardness of the at least one flexible glass layer is greater than or equal to 7H.

In an embodiment, a thickness of the ultra-thin glass layer is 10 µm~50 µm.

In an embodiment, a thickness of the at least one organic layer is 5 µm~20 µm.

In an embodiment, a material of the at least one organic layer is selected from one or more of polyimide, polyethylene and polymethyl methacrylate.

According to another aspect of the present application, a flexible display module is provided, which includes any one of the flexible display screen cover plate described above.

According to another aspect of the present application, a flexible display device is provided, which includes the flexible display screen module described above.

The flexible display screen cover plate, the flexible display module and the flexible display device provided by the present application can simultaneously have a good bendability, a transparency, an ultra-thinness function, and a sufficient strength and so on.

DETAILED DESCRIPTION

In order to make purposes, technical means and advantages of the present application more clear, the present application will be further described in detail below with reference to the drawings.

Flexible or rigid cover plates are used in mostly flexible screens in the prior art. But the cover plates of a flexible material have an insufficient hardness and cannot protect the display screen well, and the cover plates of a rigid material have a poor bendability and are bad for the bending of a flexible display screen.

As shown in FIGS. 1 to 8, a flexible display screen cover plate of the present application includes a composite laminated structure including a flexible glass layer 1 and an organic layer 2 arranged in a laminated manner. A thickness of the flexible glass layer 1 is 10 μm~50 μm, and a thickness of the organic layer 2 is 5 μm~20 μm. In this case, an ultra-thinness function of the flexible display screen cover plate can be realized. Further, a hardness of the flexible glass layer 1 may be greater than or equal to 7H. In this case, the flexible display screen cover plate will have a sufficient hardness.

Through providing the composite lamination structure including the flexible glass layer and the organic layer and utilizing rigid characteristics of a glass material, the flexible display screen cover plate can protect a display screen body of the flexible display screen under the impact of an external force while the hardness of the flexible display screen cover plate can be ensured. By utilizing flexible characteristics of an organic material, a bendability of the flexible display screen cover plate may be improved, which makes the flexible display screen to have a better bendability. And under the impact of the external force, the organic material can also release a part of the external force through deformation, thereby the impact of the external force to the flexible display screen cover plate and the display screen body is reduced. The bendability of the flexible display screen cover plate is improved, at the same time, after being damaged by a strong external force to the flexible glass layer, fragments of the flexible glass layer can be adhered on the organic layer to prevent the fragments from scattering and damaging the display screen body.

In an embodiment, the flexible glass layer 1 may be an ultra-thin glass, and a thickness of the ultra-thin glass is 10 μm~50 μm. The ultra-thin glass has a rigid characteristic brought by glass material and also has bendability. Therefore, by using the ultra-thin glass as raw material, the flexible display screen cover plate can have an ultra-thin thickness and have a better bendability and a sufficient hardness at the same time. A material of the organic layer 2 may be selected from one or more of PI (Polyimide) (such as CPA (Colorless Polyamide)), PE (Polyethylene) and PMMA (Polymethyl Methacrylate).

Figure 1:
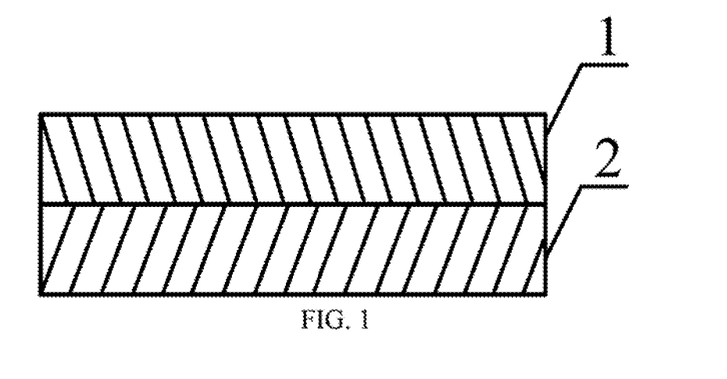
FIG. 1 is a schematic diagram showing a lamination manner between a flexible glass layer and an organic layer of a flexible display screen cover plate according to an embodiment of the present application.
Figure 2:
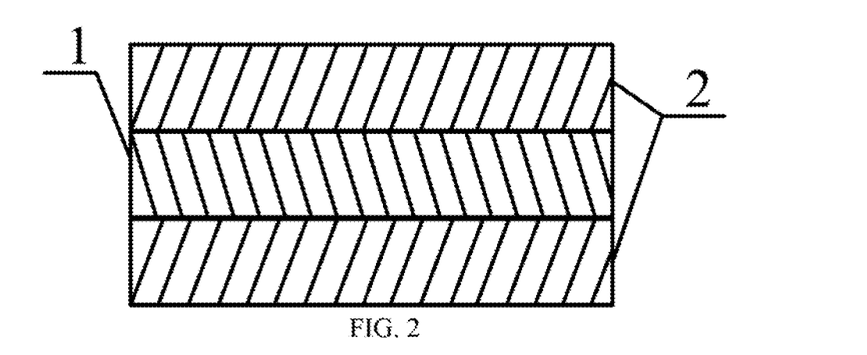
FIG. 2 is a schematic diagram showing the lamination manner between the flexible glass layer and the organic layer of the flexible display screen cover plate according to another embodiment of the present application.

A lamination manner between the flexible glass layer 1 and the organic layer 2 may be a case shown in FIG. 1, that is, the flexible glass layer 1 and the organic layer 2 are sequentially laminated, or may be a case shown in FIG. 2, that is, each of the flexible glass layers 1 is sandwiched between two organic layers 2. In the present application, "sequentially laminated" means that one layer of the flexible glass layer 1 and one layer of the organic layer 2 stacking with each other are repeatedly laminated as a repeating unit, and "each of the flexible glass layer 1 is sandwiched between two organic layers 2" means that there is none of the flexible glass layer 1 is not sandwiched by two organic layers 2.

Further, in the present application, the flexible glass layer 1 may be sandwiched between two organic layers 2. However, the present application is not limited to this. For example, the flexible glass layer 1 may be sandwiched between three organic layers 2, that is, there are one organic layer 2 and two organic layers 2 on two sides of the flexible glass layer 1 respectively. By providing the organic layer on both sides of the flexible glass layer, it is more effective to protect the flexible glass layer by utilizing the organic layer located on both sides while both the sufficient hardness and the bendability of the flexible display screen cover plate can be ensured. Under the impact of the external force, the organic material can also release a part of the external force by deformation and reduce the impact of the external force to the flexible display screen cover plate and the display screen body, which prevents the flexible glass layer from being damaged by the external force and further improves the bendability of the flexible display screen cover plate. At the same time, after the flexible glass layer being damaged by the strong external force, fragments of the flexible glass layer can be adhered on the organic layers located on both sides to prevent the fragments from scattering and damaging the display screen body.

The present application does not limit the layer number of the flexible glass layer 1 and the organic layer 2. For example, in the case shown in FIG. 1, the layer number of both the flexible glass layer 1 and the organic layer 2 may be at least one. In the case shown in FIG. 2, the layer number of the flexible glass layer 1 may be at least one and the layer number of the organic layer 2 may be at least two. However, based on the viewpoint of the ultra-thinness function with both the flexibility and the bendability, in the case shown in FIG. 1, the flexible display screen cover plate preferably has one flexible glass layer 1 and one organic layer 2. In the case shown in FIG. 2, the flexible display screen cover plate preferably has one flexible glass layer 1 and two organic layers 2. It should be understood that when the composite laminated structure is a structure with more than two layers, the hardness and the bendability of the flexible display screen cover plate can be further improved, and therefore it is also feasible.

Figure 3:
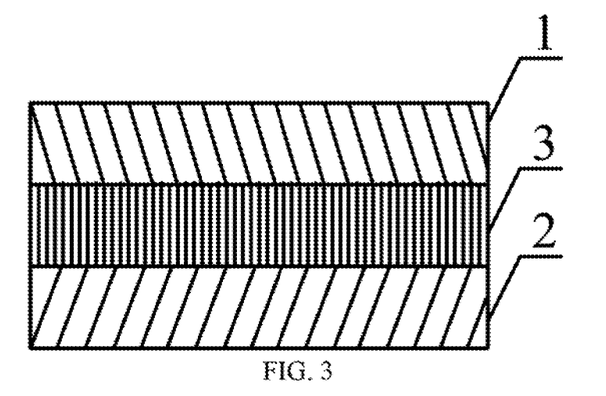
FIG. 3 is a schematic diagram showing a connecting manner between the flexible glass layer and the organic layer of the flexible display screen cover plate according to an embodiment of the present application.

FIG. 3 is a schematic diagram showing a connecting manner between the flexible glass layer 1 and the organic layer 2 of the flexible display screen cover plate according to an embodiment of the present application. As shown in FIG. 3, the flexible glass layer 1 and the organic layer 2 may be connected together by being bonded with each other.

In an embodiment, an optically transparent adhesive 3 (for example, Optically Clear Adhesive, OCA) may be provided between the flexible glass layer 1 and the organic layer 2 for connecting. A fabrication manner of the flexible display screen cover plate in the embodiment may be that after the optically transparent adhesive 3 being coated on a surface of the flexible glass layer 1, the organic layer 2 is coated on a surface of the optically transparent adhesive 3.

The OCA has characteristics such as being colorless and transparent, a light transmittance of more than 90%, a good bonding strength, and curing at a room temperature or a medium temperature and with a small curing shrinkage. By using the OCA to bond the flexible glass layer and the organic layer, stable bonding of the flexible glass layer and the organic layer can be realized without affecting a display effect of the flexible display screen. Moreover, by providing an OCA layer, when the flexible display screen cover plate suffers the impact of an external force, the OCA layer can also absorb and release a part of the external force and reduce the impact of the external force to the flexible display screen cover plate and the display screen body, thereby the bendability of the flexible display screen cover plate is further improved and the bendability of the flexible display screen is improved.

It should be understood that the present application may select different adhesives according to different application scenarios to realize bonding between the flexible glass layer and the organic layer as long as a selected adhesive can ensure bonding strength between the flexible glass layer and the organic layer. The type of the adhesives is not limited in the present application.

In an embodiment, a thickness of the optically transparent adhesive 3 may be in the range of 5 μm~10 μm. In order to ensure that the thickness of the flexible display screen cover plate is not excessively large because of providing the optically transparent adhesive, and in order to ensure that the bonding strength between the flexible glass layer and the organic layer meets actual usage requirements, the thickness of the optically transparent adhesive is 5 μm~10 μm in this embodiment.

It should be understood that the present application may select different thicknesses of the adhesive according to different application scenarios as long as the thickness of a selected adhesive can ensure the bonding strength between the flexible glass layer and the organic layer, and the thickness of the adhesive is not limited in the present application.

FIGS. 4-7 are other schematic diagrams showing a connecting manner between the flexible glass layer and the organic layer of the flexible display screen cover plate according to other embodiments of the present application. As shown in FIGS. 4-7, the flexible glass layer 1 and the organic layer 2 may be connected together by being embedded within each other to improve a connecting strength between the flexible glass layer and the organic layer.

In the present application, a surface of the flexible glass layer 1 contacted with the organic layer 2 may include at least one groove 4 in which the organic layer 2 is embedded. The groove 4 may be formed by etching, which is a half etching, and that is, a depth of the groove 4 is smaller than a thickness of the flexible glass layer 1. An fabrication manner of the flexible display screen cover plate may be that the surface of the flexible glass layer 1 is half etched to form one or more grooves by etching at first, and then the organic layer is coated on the side of the flexible glass layer with the groove, the organic layer will automatically enter the groove due to its nature.

By providing the groove, not only peeling of the flexible glass layer 1 and the organic layer 2 can be avoided during a bending process of the flexible display screen, but also a usage of adhesives can be decreased, thereby the thickness of the flexible display screen cover plate is decreased. Further, an ultra-thinness function of the flexible display screen cover plate is promoted, and a bendability of the flexible display screen cover plate is improved.

In the present application, a ratio of open areas of all the grooves 4 to an area of a surface of the flexible glass layer 1 on which the grooves 4 are formed may be 30%~60%. The "open" means an open of the grooves 4 on the surface of the flexible glass layer 1 on which the grooves 4 are formed.

In order to sufficiently ensure the connecting strength between the flexible glass layer and the organic layer, it is preferable to provide a plurality of the grooves 4 on the surface of the flexible glass layer 1 contacted with the organic layer 2, and the plurality of the grooves 4 may be uniformly distributed on the surface of the flexible glass layer 1 contacted with the organic layer 2. The connecting strength of the flexible glass layer 1 and the organic layer 2 can be improved by densely providing the grooves 4. However, in consideration of actual requirements of the connecting strength, decreasing a dense degree of the grooves 4 on the basis of satisfying the connecting strength can reduce difficulty of etching processes and decrease workloads. Therefore, preferably, the dense degree of the grooves 4 is set at 30%~60%. For example, the open area of the grooves 4 may be 25 μm$^2$~400 μm$^2$, and further, the depth of the grooves 4 may be 2 μm~10 μm.

Figure 4:
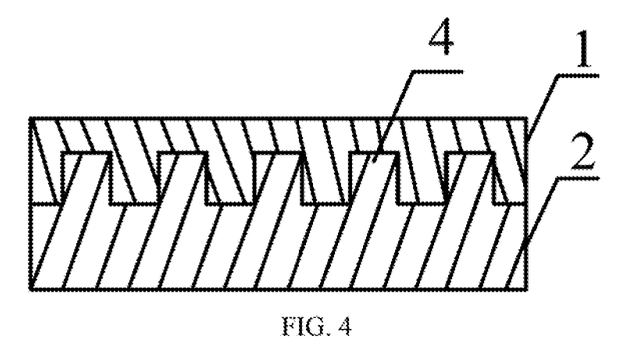
FIGS. 4-7 are other schematic diagrams showing the connecting manner between the flexible glass layer and the organic layer of the flexible display screen cover plate according to other embodiments of the present application.

In an embodiment, as shown in FIG. 4, a cross-sectional shape of the groove 4 may be a substantially square shape (rectangular or square). A square groove is simple to be implemented and can satisfy requirements for the connecting strength of the flexible glass layer and the organic layer.

Figure 5:
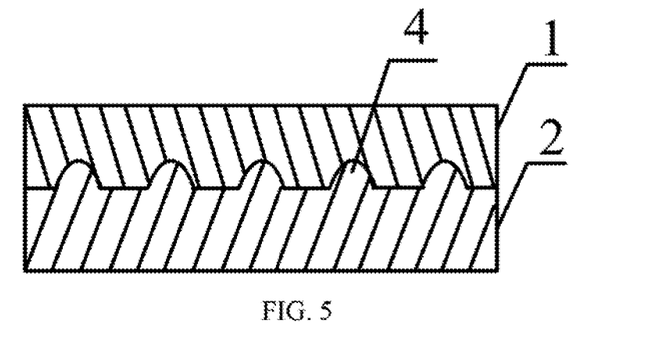

In an embodiment, as shown in FIG. 5, the cross-sectional shape of the groove 4 may be a substantially circular arc shape. A circular arc groove is simple to be implemented and can effectively disperse stress generated when the flexible display screen cover plate is bent, thereby the bendability of the flexible display screen cover plate is improved.

Figure 6:
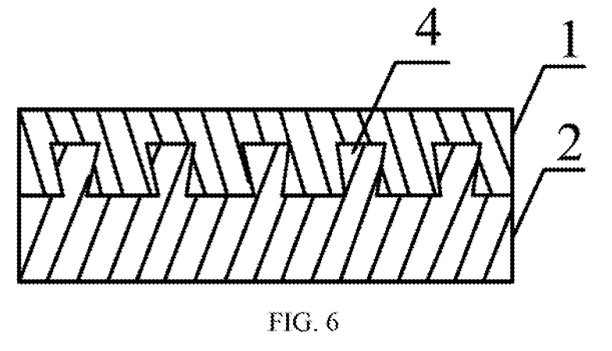

In an embodiment, as shown in FIG. 6, the cross-sectional shape of the groove 4 may be a substantially inverted trapezoidal shape. In the case that the open area is the same, an inverted trapezoidal groove can further enhance the connecting strength between the flexible glass layer and the organic layer.

Figure 7:
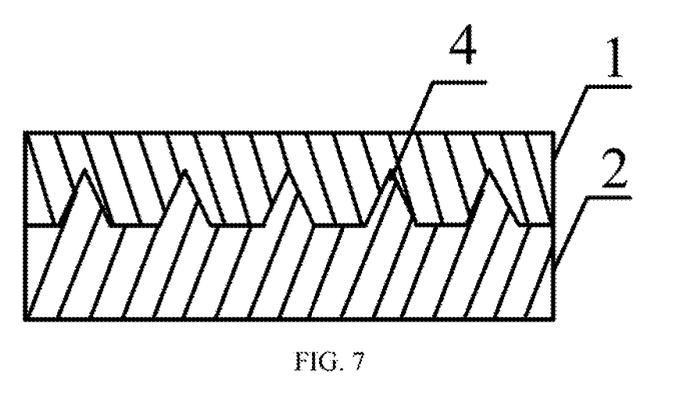

In an embodiment, as shown in FIG. 7, the cross-sectional shape of the groove 4 may be a substantially triangular shape. A triangular groove has advantages of being implemented simply, dispersing the stress, and improving the connecting strength.

It should be understood that the cross-sectional shape of the groove 4 is not limited to the above shape as long as demands of the connecting strength between the flexible glass layer and the organic layer is satisfied. For example, the cross-sectional shape of the groove 4 may be selected from a combination of any two or more of the square shape, the circular arc shape, the inverted trapezoidal shape and the triangular shape.

Figure 8:
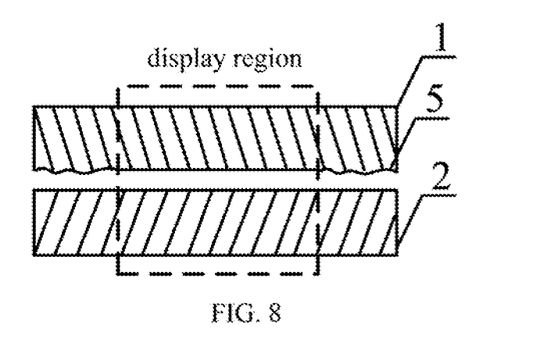
FIG. 8 is another schematic diagram showing the connecting manner between the flexible glass layer and the organic layer of the flexible display screen cover plate according to an embodiment of the present application.

FIG. 8 is another schematic diagram showing the connecting manner between the flexible glass layer and the organic layer of the flexible display screen cover plate according to an embodiment of the present application. As shown in FIG. 8, the connecting strength of the flexible glass layer 1 and the organic layer 2 is improved by roughening a surface of the flexible glass layer 1 which is located in a non-display region and contacted with the organic layer 2 (a surface 5 in FIG. 8), that is, the surface 5 is a rough surface. As an example of roughening, the rough surface may be realized by shot peening.

By roughening the surface of the flexible glass layer 1 which is located in the non-display region and contacted with the organic layer 2, a roughness degree of the surface 5 of the flexible glass layer 1 is increased, thereby the connecting strength of the flexible glass layer 1 and the organic layer 2 can be improved, and a peeling of the flexible glass layer 1 and the organic layer 2 during a bending process of a flexible display screen is avoided. In addition, the adhesive force of the organic layer to the flexible glass layer is improved because of the surface 5, a usage of adhesives can be decreased, thereby the thickness of the flexible display screen cover plate is decreased, and an ultra-thinness function of the flexible display screen cover plate is further promoted and the flexibility of the flexible display screen cover plate is improved.

It should be understood that the connecting manner between the flexible glass layer and the organic layer of the flexible display screen cover plate of the present application may be a combination of one or more of above connecting manners. For example, the flexible glass layer and the organic layer may be connected together by the connecting manner shown in FIG. 3 and FIG. 8, or the flexible glass layer and the organic layer may be connected together by above three connecting manners, thereby the connecting strength between the flexible glass layer and the organic layer is further improved.

In another aspect, a flexible display module is also provided by the present application, and the flexible display module includes any one of the flexible display screen cover plate described above. The flexible display module simultaneously has a good bendability, a transparency, an ultra-thinness function, and a sufficient strength and so on.

In another aspect, a flexible display device is also provided by the present application, and the flexible display device includes the flexible display screen module described above. The flexible display device simultaneously has a good bendability, a transparency, an ultra-thinness function, and a sufficient strength and so on.

The above are only the preferred embodiments of the present application, and are not intended to limit the protective scope of the present application. Any modifications, equivalent replacements, improvements, etc. made within the spirit and principles of the present application should be included within the protective scope of the present application.

What is claimed is:

1. A flexible display screen cover plate, wherein the flexible display screen cover plate is used to cover a flexible display screen body of a flexible display screen, and the flexible display screen cover plate comprises:
   a composite laminated structure comprising at least one flexible glass layer and at least one organic layer;
   wherein the at least one flexible glass layer and the at least one organic layer are connected by being embedded within each other,
   a surface of the at least one flexible glass layer contacted with the at least one organic layer comprises a plurality of grooves, the at least one organic layer is embedded in the plurality of grooves, and
   a depth of each one of the plurality of grooves is smaller than a thickness of the flexible glass layer, and the organic layer is coated on the side of the flexible glass layer with the plurality of grooves, such that the organic layer automatically enters the plurality of grooves due to its nature.

2. The flexible display screen cover plate according to claim 1, wherein the composite laminated structure comprises at least one flexible glass layer and at least one organic layer that are sequentially laminated.

3. The flexible display screen cover plate according to claim 1, wherein the composite laminated structure comprises at least one flexible glass layer and at least two organic layers, and each of the at least one flexible glass layer is sandwiched between two of the at least two organic layers.

4. The flexible display screen cover plate according to claim 1, wherein the at least one flexible glass layer and the at least one organic layer are connected together by adhering.

5. The flexible display screen cover plate according to claim 4, wherein the at least one flexible glass layer and the at least one organic layer are connected together by an optically transparent adhesive.

6. The flexible display screen cover plate according to claim 5, wherein the optically transparent adhesive comprises an optically clear adhesive.

7. The flexible display screen cover plate according to claim 5, wherein a thickness of the optically transparent adhesive is 5 μm~10 μm.

8. The flexible display screen cover plate according to claim 1, wherein a cross-sectional shape of the at least one groove is selected from one or more of a square shape, a circular arc shape, an inverted trapezoidal shape, and a triangular shape.

9. The flexible display screen cover plate according to claim 1, wherein a ratio of an open area of the at least one groove to an area of the surface of the at least one flexible glass layer which comprises the at least one groove is 30% to 60%.

10. The flexible display screen cover plate according to claim 1, wherein the open area of the at least one groove is 25 μm²~400 μm².

11. The flexible display screen cover plate according to claim 1, wherein a depth of the at least one groove is 2 μm~10 μm.

12. The flexible display screen cover plate according to claim 1, wherein a surface of the at least one flexible glass layer that located in a non-display region and contacted with the at least one organic layer is a rough surface, such that a roughness degree of a surface, facing the organic layer, of the flexible glass layer located in a non-display region of the flexible display screen is greater than a roughness degree of another surface, facing the organic layer, of the flexible glass layer located in a display region of the flexible display screen.

13. The flexible display screen cover plate according to claim 1, wherein a hardness of the at least one flexible glass layer is greater than or equal to 7 H.

14. The flexible display screen cover plate according to claim 1, wherein a thickness of the flexible glass layer is 10 μm~50 μm.

15. The flexible display screen cover plate according to claim 1, wherein a thickness of the at least one organic layer is 5 μm~20 μm.

16. The flexible display screen cover plate according to claim 1, wherein a material of the at least one organic layer is selected from one or more of polyimide, polyethylene and polymethyl methacrylate.

17. A flexible display module, comprising the flexible display screen cover plate according to claim 1.

18. A flexible display device, comprising the flexible display module according to claim 17.

* * * * *